United States Patent [19]

Harvey et al.

[11] Patent Number: 4,717,912
[45] Date of Patent: Jan. 5, 1988

[54] APPARATUS FOR PRODUCING ANY ONE OF A PLURALITY OF SIGNALS AT A SINGLE OUTPUT

[75] Inventors: Paul W. Harvey, Santa Clara; Bradford S. Kitson, Castro Valley; Warren K. Miller, Jr., Hayward, all of Calif.

[73] Assignee: Advanced Micro Devices, Inc., Sunnyvale, Calif.

[21] Appl. No.: 433,253

[22] Filed: Oct. 7, 1982

[51] Int. Cl.[4] .............................................. H04Q 1/00
[52] U.S. Cl. ............................ 340/825.83; 307/465; 340/825.87; 340/825.89
[58] Field of Search .................. 340/825.83, 825.87, 340/825.89, 825.22; 307/57, 58, 80, 465, 468, 303, 62, 463, 269; 328/36, 57, 61, 104, 152, 62

[56] References Cited

U.S. PATENT DOCUMENTS

| Re. 29,917 | 2/1979 | Kumakawa et al. | 307/465 |
| 2,504,999 | 4/1950 | McWhirter et al. | 328/104 X |
| 2,863,049 | 12/1958 | Lee et al. | 328/104 |
| 3,656,115 | 4/1972 | Foerster | 340/825.84 |
| 4,032,894 | 6/1977 | Williams | 340/825.87 X |
| 4,044,312 | 8/1977 | D'Ortenzio | 307/464 X |
| 4,124,899 | 11/1978 | Birkner et al. | 307/465 |
| 4,157,480 | 6/1979 | Edwards | 307/465 |
| 4,422,072 | 12/1983 | Cavlan | 340/825.83 X |
| 4,450,365 | 5/1984 | Hoff, Jr. et al. | 328/61 X |

*Primary Examiner*—Ulysses Weldon
*Attorney, Agent, or Firm*—Patrick T. King; Martin C. Fliesler

[57] ABSTRACT

An integrated circuit package having a plurality of pins and a plurality of output structures connected, respectively, to the plurality of pins. Each output structure selectively provides any one of four signals including a registered signal, non-inverted or inverted, or a non-registered signal, non-inverted or inverted, to a pin. Each output structure is configurable or field-programmable by a user or purchaser of the package to provide it with any desired combination of registered and non-registered outputs.

35 Claims, 6 Drawing Figures

APPARATUS FOR PRODUCING ANY ONE OF A PLURALITY OF SIGNALS AT A SINGLE OUTPUT

TECHNICAL FIELD

The present invention relates generally to apparatus for producing any one of a plurality of signals at a single output and, more particularly, to output structure of a chip for connection to a pin of an integrated circuit package.

BACKGROUND ART

Logic functions are implemented using integrated circuit (IC) technology such as large scale integration (LSI). An integrated circuit package includes a chip, on which the logic functions are implemented, a plurality of pins and an architecture known as output structures, among other integrated logic components on the chip. The output structures are coupled to the pins to transfer logic signals from the chip via the pins to other IC packages.

A class of chips has been developed which are known as field-programmable logic families. The logic families are "field-programmable", which means that these chips can be programmed or modified by the chip users or purchasers with the aid of readily available programming equipment to change the logic, as desired. For example, one member of this logic class is the field-programmable logic sequencer whose output structures include built-in registers and combinatorial or non-registered logic. The output signals of the registers are known as stored or registered signals or outputs, whereas the output signals of the combinatorial logic are known as non-stored or non-registered signals. Specifically, the combinatorial logic can be programmed to provide non-inverted non-registered signals or inverted non-registered signals.

One disadvantage with the prior field-programmable logic families is that they have fixed numbers or combinations of registers and combinatorial logic gates. For example, one logic sequencer may have four registers whose signal outputs are connected to four pins, respectively, and eight combinatorial logic gates whose signal outputs are connected to eight pins, respectively. Another logic sequencer may have six registers and a like number of combinatorial logic gates whose signal outputs are connected, respectively, to twelve pins. However, a user or purchaser may need only three registers or five registers, thereby resulting in an inefficient or lack of use of register resources and pins since the purchased logic sequencer will have four or six registers, respectively, connected to a like number of pins. In other words, a user or purchaser may not be able to utilize efficiently a logic sequencer with the exact number of registers and pins needed. Furthermore, a given logic sequencer may not implement a given logic function should more registers be needed than are available on such a sequencer. Also, a user would need to purchase a variety of different logic sequencers to cover all applications, which increases inventory and production costs.

Another disadvantage of the prior logic sequencers is that each register and each combinatorial logic gate is dedicated or coupled to a particular pin, respectively. This can present problems related to the lay-out of the logic circuit on the chip. For example, it may be more space-saving or otherwise advantageous to have a given register laid out near an upper part of the chip, but the dedicated nature of the chip to the user or purchaser may contrain the location of the given register near a pin at the middle or lower portion of the chip.

The present invention is directed to overcoming all of the problems mentioned above.

SUMMARY OF THE INVENTION

The present invention is an apparatus for producing an output signal at a single output, including means for providing a stored non-inverted first signal and a non-stored non-inverted second signal and or an inverted third signal of the first signal and an inverted fourth signal of the second signal, and means for selecting the first signal or the second signal or the third signal or the fourth signal for the output signal.

The four signals described above can be stored or registered signals and non-stored or non-registered signals, one of which is selected by the selecting means. A plurality of this apparatus can be implemented as output structures on a chip which are coupled to respective pins. A user can then individually cause the selecting means of any one apparatus to select any one of the four signals. Thus, for example, if only three registers are required, then three of these apparatus can be configured for providing the registered signals, either non-inverted or inverted, with the remaining plurality of apparatus being configured for non-stored outputs, non-inverted or inverted. Consequently, contrary to the prior art, the present invention provides maximum utilization of register and pin resources and design flexibility of configuring each output structure on a chip as needed and where needed.

DETAILED DESCRIPTION OF THE INVENTION

Figure 1:
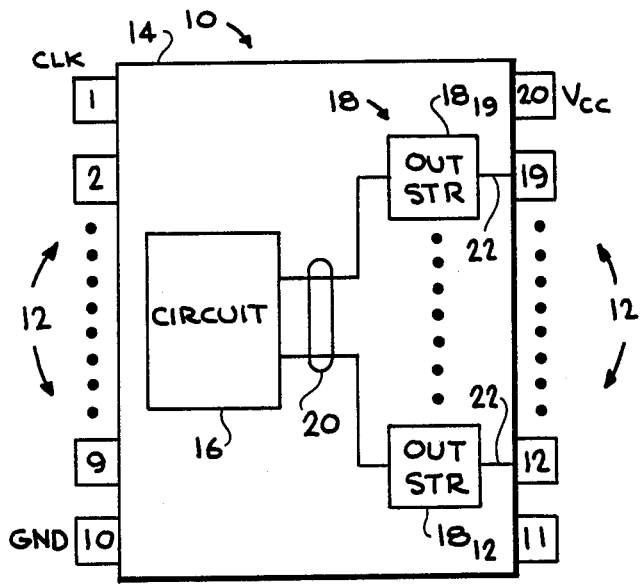
FIG. 1 illustrates an integrated circuit package.

FIG. 1 shows an integrated circuit package 10 having a plurality of pins 12. The particular package 10 that is shown is indicated as having twenty pins $12_1$–$12_{20}$, although other packages can have different numbers of pins, such as a package having twenty-four pins. Package 10 has, for example, pins $12_2$–$12_5$ which can function as data input pins and pins $12_{12}$–$12_{19}$ which can function as data output or bidirectional data input-output (I/O) pins.

Package 10 houses a chip 14 on which a logic circuit 16 is implemented. The architecture of chip 14 also includes a plurality of output structures 18 which receive inputs from the logic circuit 16 via lines shown generally at 20 and provide output signals on respective single outputs 22. As one example, there are eight respective output structures $18_{12}$–$18_{19}$ connected via respective single outputs $22_{12}$–$22_{19}$ to respective pins $12_{12}$–$12_{19}$.

Figure 2A:
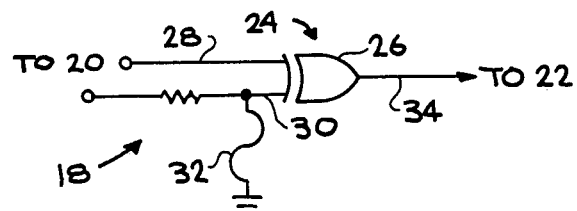
FIG. 2A and FIG. 2B are illustrations of prior art output structures.
Figure 2B:
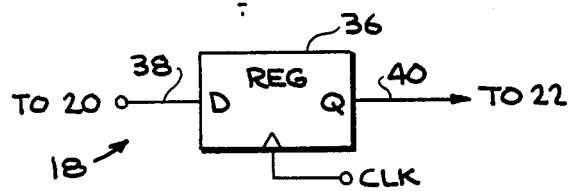

FIG. 2A shows one type of prior output structure 18 and FIG. 2B illustrates another type of an output structure 18. FIG. 2A depicts combinatorial logic 24 and, in particular, an exclusive-OR gate 26 having one input 28 which is connected to one of the lines 20 and another input 30 which is connected to ground through a burnable fuse 32. The output of gate 26 is on a single line 34, which is coupled to one of the single outputs 22. An output signal on line 34 is known as a non-stored or non-registered signal.

The burnable fuse 32 will control the gate 26 so as to invert or not to invert an input signal on line 28 depending on whether or not fuse 32 is in-circuit. If fuse 32 is not burned out, line 30 is connected to ground or at logic 0 and the output signal on line 34 will be the same polarity, i.e., not inverted, as the input signal on line 28. If fuse 32 is burned out, i.e., not in-circuit, line 30 will not be connected to ground and will be at logic 1. Consequently, the output signal on line 34 will be an inverted signal of the input signal on input line 28. A user or purchaser of the chip 14 can select to burn out fuse 32 employing well-known techniques or to maintain fuse 32 in-circuit.

In FIG. 2B, an output structure 18 includes a data storage register 36 having a data input D connected over a line 38 to one of the lines 20 and an output Q coupled over a single output line 40 to one of the single outputs 22. Register 36 is a typical built-in register previously mentioned and its output Q on line 40 is known as a registered or stored signal.

Prior packages 10 are manufactured with a fixed number or combination of registers 36 and combinatorial logic gates 24, each dedicated or connected to a corresponding pin 12. Thus, a prior package 10 may have four output structures 18 each with a built-in register 36, although the user or purchaser of package 10 may need only three such registers 36, thereby wasting a resource of one built-in register 36 and one pin 12. Furthermore, the location of each of the four registers 36 is fixed by the manufacturer so that, for example, these may be positioned near the center of chip 14 to be connected to central pins $12_{14}$–$12_{17}$. For various reasons, however, the user or purchaser of package 10 may want these four registers 36 at the bottom of chip 14 and connected to pins $12_{12}$–$12_{15}$, respectively.

Figure 3:
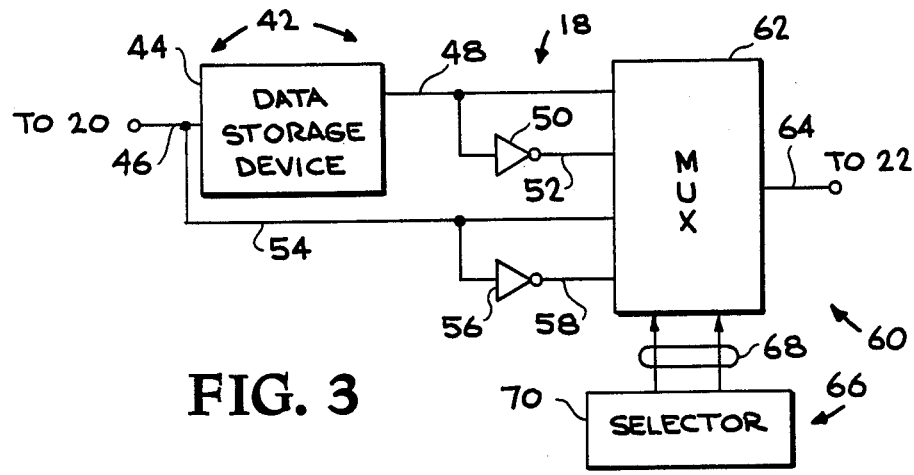
FIG. 3 is a block diagram of one embodiment of the present invention.

With reference to FIG. 3, there is shown one embodiment of an apparatus or output structure 18 of the present invention for producing one of a selected number of signals on a given single output 22. As will be shown, these signals can be non-inverted or inverted stored or registered signals and non-inverted or inverted non-stored or non-registered signals. The user or purchaser of the package 10 having the output structure 18 of FIG. 3 can select the desired signal.

The output structure 18 of FIG. 3 includes a means 42 for providing, for example, four signals inclding a non-inverted stored signal, a non-inverted non-stored signal, an inverted signal of the stored signal and an inverted signal of the non-stored signal. Specifically, means 42 includes a data storage device 44 having a data input D connected to an input line 46 that leads to one of the lines 20 shown in FIG. 1. Data storage device 44 stores and outputs a non-inverted stored signal on an output line 48. An inverter 50 inverts the stored signal on line 48 to provide an inverted signal of the stored signal on a line 52.

Means 42 also includes a conductor or line 54 which is coupled to one of the lines 20 to carry a non-stored signal which is not inverted. An inverter 56 inverts the non-stored signal on conductor 54 to provide a non-stored inverted signal on a line 58.

The output structure 18 of FIG. 3 also includes a means 60 for selecting one of the above-mentioned four signals. Means 60 includes a multiplexer 62 having four inputs connected respectively to the four lines 48, 52, 54 and 58, and a single output 64 connected to one of the single outputs 22 shown in FIG. 1. A selector 66 of means 60 produces, for example, a 2-bit output on two control lines shown generally at 68 to cause or enable multiplexer 62 to couple or switch one of the four lines 48, 52, 54 and 58 to the single output 64.

Selector 66 can be any component that can be programmed by a user or purchaser of package 10 to provide a particular 2-bit pattern on lines 68. As one example, selector 66 can be a register 70 which can be loaded using known techniques to set a particular 2-bit pattern in the register. For example, register 70 can be set to store a bit pattern 01, resulting in multiplexer 62, in response to these bits on lines 68, coupling line 52 to line 64. Alternatively, selector 66 can be a pair of burnable fuses (not shown) connected to ground, any one or both of which can be burned out by a user or purchaser, or left in-circuit, to provide the 2-bit pattern on lines 68.

Figure 4:
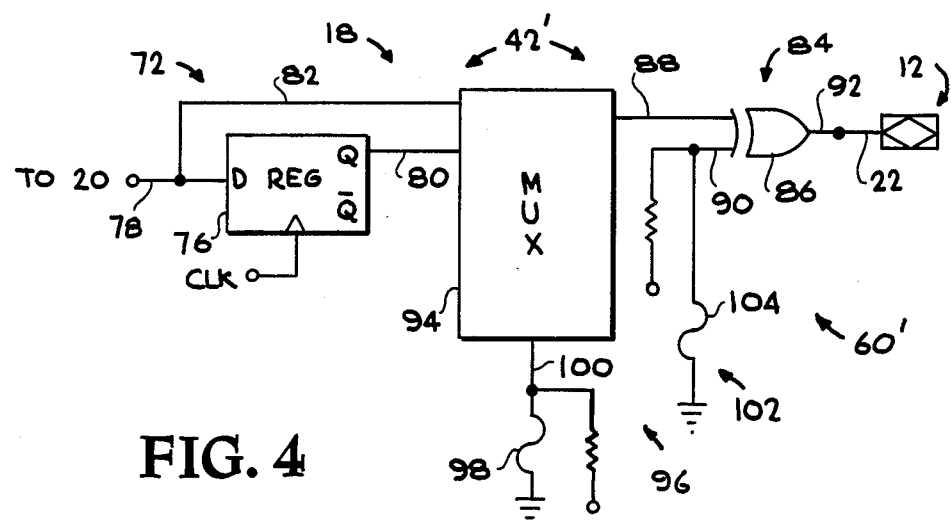
FIG. 4 is a block diagram of a preferred embodiment of the present invention.

FIG. 4 shows a preferred embodiment 72 of an output structure 18 of the present invention. Embodiment 72 includes a means 42' for providing the previously mentioned four signals on one of the outputs 22 in response to a logic signal on one of the input lines 20, together with a means 60' for selecting one of the four signals. Embodiment 72 can also include a feedback network 74 (see FIG. 5), as will be described in detail in FIG. 5.

Means 42' for providing the four signals includes a storage register 76 having a data input D connected to an input line 78 that leads to one of the lines 20. Register 76 produces an output Q on a line 80 which constitutes a non-inverted stored or registered signal. Means 42' also has a conductor or line 82 that is coupled to line 78 and carries a non-stored, non-inverted signal. A logic gate 84 of means 42', in particular an exclusive-OR gate 86, functions to gate through the non-inverted stored signal or the non-inverted, non-stored signal or to invert these respective signals. Gate 86 has a data input 88, a control input 90 and a single output 92 coupled to one of the single outputs 22. In FIG. 4, a bi-directional pin 12 is shown connected to a single output 22.

Embodiment 72 also includes the means 60' for selecting any one of the four signals to be outputted onto the single output 22. Means 60' includes a multiplexer 94 having two inputs connected, respectively, to line 80 and line 82, and an output connected to line 88. A means 96 controls multiplexer 94 to couple either line 80 or line 82 to line 88, thereby selecting either the non-inverted, stored signal on line 80 or the non-inverted, non-stored signal on line 82. Means 96 can be a burnable fuse 98 which can be used by a user or purchaser of package 10 to program multiplexer 94 via a control line 100. If fuse 98 remains in-circuit, line 100 is at logic 0 and if fuse 98 is burned out by the user employing conventional field programming techniques, then line 100 is at logic 1. Therefore, multiplexer 94 will be controlled to couple or switch line 80 or line 82 to line 88 depending on the logic state of line 100.

Means 60' further includes a means 102 for controlling gate 86 not to invert or to invert the signal coupled by multiplexer 94 onto line 88 thereby selecting the polarity of this signal. Means 102 can be a burnable fuse 104 similar to fuse 98. If fuse 104 remains in circuit, line 90 is at logic 0 and the signal on line 88 is gated through onto line 92. If fuse 104 is burned out by a user or purchaser, line 90 is at logic 1, whereby the signal on line 88 is inverted onto line 92.

In the embodiment 72, the user or purchaser can individually program the means 42' to select either the stored signal or the non-stored signal by maintaining or not maintaining fuse 98 in circuit and can individually program means 42' to provide the non-inverted or inverted forms of these selected signals by maintaining or not maintaining fuse 104 in circuit. For example, if fuse 98 were not burned out and fuse 104 were burned out, then multiplexer 94 would select the non-inverted stored signal on line 80 and couple this signal to line 88, and then gate 86 would provide an inverted signal of the stored signal on line 92. As another example, if fuse 98 were burned out and fuse 104 were not, multiplexer 94 would select the non-stored, non-inverted signal on line 82 and gate 86 would gate this signal, non-inverted, onto line 92.

Figure 5:
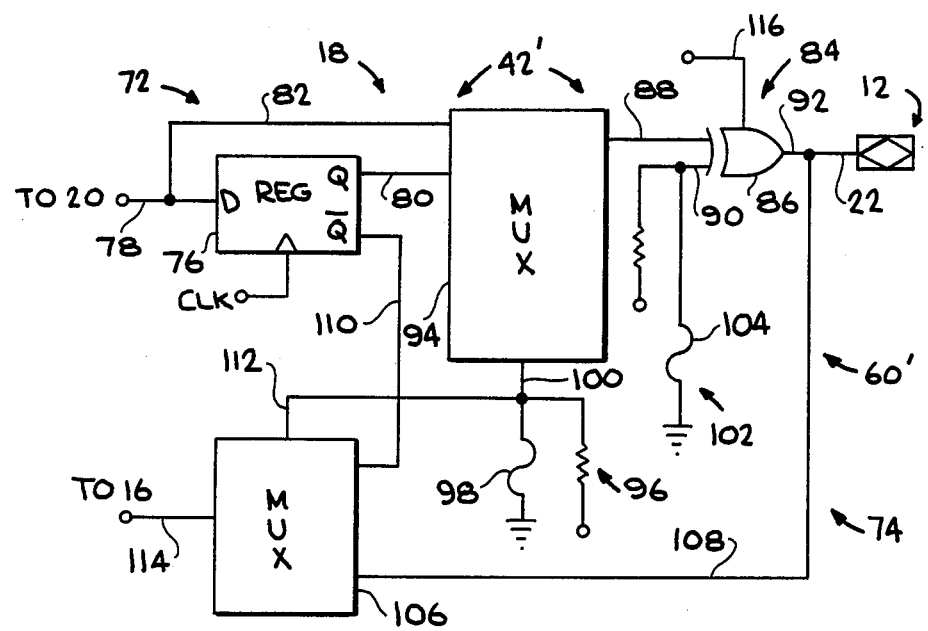
FIG. 5 is a block diagram of a modified form of the embodiment of FIG. 4.

With reference to FIG. 5, as previously mentioned embodiment 72 can be modified to include a feedback network 74. The feedback network 74 includes a multiplexer 106 having one input connected to output 22 via a line 108 and another input connected to the output $\overline{Q}$ of register 76 via a line 110. Multiplexer 106 is controlled, via the logic state of a control line 112 connected to line 100, to couple either line 108 or line 110 to an output line 114 leading back into logic circuit 16 shown in FIG. 1. Also, gate 86 is enabled and/or disabled via logic signals on a tri-state control line 116.

In the operation of feedback circuit 74, if gate 86 is enabled by the control signal on line 116, the signal on line 92 is outputted onto line 22 and pin 12 and fed back over line 108. Multiplexer 106 can then select the signal on line 108 or the signal on line 110, depending on the state of line 112. If gate 86 is disabled by the control signal on line 116, then any signal inputted onto line 22 via pin 12 is fed over line 108 to multiplexer 106 and a similar selection occurs. If gate 86 is alternately enabled and disabled, the above-described operations alternately occur.

Industrial Applicability

In accordance with the present invention, an IC package 10 can be manufactured having a plurality of output structures 18 of the type shown in FIG. 3 or, preferably, FIG. 4 to which reference will continue. Then, a user or purchaser of the package 10 can individually configure each of the output structures 18 to provide a registered output or non-registered output, either non-inverted or inverted, by burning out or not burning out fuse 98 and fuse 104. Thus, for example, if the user or purchaser needs only three registered outputs, inverted or non-inverted, with the remaining outputs being non-registered, only three of the output structures 18 need be so programmed. Furthermore, if these three registered outputs advantageously should be located near the bottom of chip 14, then output structures $18_{12}$–$18_{14}$ would be so programmed.

In general, therefore, for a package 10 having a given plurality of output structures 18, any combination of registered outputs and non-registered outputs, non-inverted or inverted, can be field-programmed by the user or purchaser and be located at a convenient portion of chip 14.

Other aspects, objects and advantages of the invention can be obtained from a study of the drawings, the disclosure and the appended claims.

We claim:

1. An output structure for connection between a logic circuit producing a logic signal and a pin of a package, comprising:
   (a) first means, responsive to the logic signal, for providing a stored non-inverted first signal;
   (b) second means, responsive to the logic signal, for providing a non-stored non-inverted second signal;
   (c) first programmable means for coupling therethrough said first signal or said second signal;
   (d) third means, having an output connectable to the pin, for providing at said output said coupled first signal or said coupled second signal or a third signal being inverted of said coupled first signal or a fourth signal being inverted of said coupled second signal; and
   (e) second programmable means for controlling said third providing means to provide at said output said coupled first signal or said coupled second signal or said third signal or said fourth signal.

2. An output structure, according to claim 1, wherein said first means for providing comprises a register.

3. An output structure, according to claim 1, wherein said second means for providing comprises a conductor.

4. An output structure, according to claim 1, wherein said first programmable means comprises:
   (a) means for switching said first signal or said second signal to said third providing means; and
   (b) means for controlling said switching means.

5. An output structure, according to claim 4, wherein said means for switching comprises a multiplexer.

6. An output structure, according to claim 4, wherein said means for controlling comprises a burnable fuse.

7. An output structure, according to claim 1, wherein said third means for providing comprises a logic gate.

8. An output structure, according to claim 7, wherein said second programmable means comprises a burnable fuse being connected to said logic gate.

9. An output structure, according to claim 1, further comprising means for enabling and disabling said third providing means.

10. An output structure, according to claim 1, further comprising means for feeding back any signal being on said output.

11. A chip part for connection to a plurality of pins, comprising a plurality of output structures each having a single output connectable, respectively, to one of said plurality of pins, each of said plurality of output structures further including
   (a) a storage register having a first input and a first output Q;
   (b) a multiplexer having a second input connected to said first output Q, a third input connected to said first input and a second output;
   (c) a first burnable fuse connected to said multiplexer to control the connection of said second input or said third input to said second output;
   (d) an exclusive-OR gate having one input connected to said second output, another input and said single output; and
   (e) a second burnable fuse connected to said other input of said exclusive-OR gate to control the non-inversion or inversion of a signal on said one input of said exclusive-OR gate.

12. An integrated circuit package, comprising:
   (a) a logic circuit for producing a plurality of logic signals;
   (b) a plurality of pins; and (c) a plurality of programmable output structures each having an input and an output being connected, respectively, between said logic circuit and one of said plurality of pins, each of said plurality of output structures being able to produce on said output, in response to one of said logic signals on said input a stored signal, inverted or non-inverted, or a non-stored signal, inverted or non-inverted, to one of said plurality of pins, said plurality of output structures each including
   (i) first means for selecting said stored signal, or said non-stored signal; and
   (ii) second means for selecting the polarity, inverted or non-inverted, of said stored signal or said non-stored signal.

13. An integrated circuit package, according to claim 12, wherein said first means for selecting comprises:
   (a) a multiplexer having two inputs receiving, respectively, said stored signal and non-stored signal, and having an output; and
   (b) programmable means for controlling said multiplexer to couple either of said two inputs to said ouput.

14. An integrated circuit package, according to claim 12, wherein each one of said plurality of output structures comprises means for feeding back to said logic circuit said stored signal, inverted or non-inverted, or said non-stored signal, inverted or non-inverted, provided to one of said respective pins.

15. An integrated circuit package, according to claim 14, wherein said one pin is bi-directional to transfer a signal which is external of the integrated circuit package into the integrated circuit package, and wherein said means for feeding back further comprises means for controlling the feedback of the external signal to said logic circuit.

16. An integrated circuit package, according to claim 15, wherein said means for controlling the feedback of the external signal enables the feedback to said logic circuit of either the external signal or said stored signals and said non-stored signals provided to said one pin.

17. An integrated circuit package, according to claim 12, wherein said second means for selecting comprises:
   (a) an exclusive-OR gate controlling the polarity of said stored signal or said non-stored signal; and
   (b) programmable means for controlling said exclusive-OR gate to invert or not invert said stored signal or said non-stored signal.

18. An integrated circuit package according to claim 17, wherein said exclusive-OR gate has an input, and said programmable means comprises a burnable fuse connected to said input.

19. An integrated circuit package, according to claim 12, wherein each of said plurality of output structures comprises means for producing said stored signal and said non-stored signal, and wherein
   (a) said first means for selecting comprises:
      (i) a multiplexer having two inputs connected to said producing means to receive said stored signal and said non-stored signal, and having an output; and
      (ii) an output coupled to one of said pins; controlling said multiplexer to couple either of said two inputs to said output; and
   (b) said second means for selecting comprises:
      (i) an exclusive-OR gate, having one input connected to said output and another input, and controlling the polarity of said stored signal or said non-stored signal; and
      (ii) programmable means, connected to said other input of said exclusive-OR gate, for controlling said exclusive-OR gate to invert or not invert said stored signal or said non-stored signal.

20. A circuit package, comprising:
   (a) a logic circuit for producing a plurality of logic signals;
   (b) a plurality of pins; and
   (c) a plurality of output structures coupled between said logic circuit and said plurality of pins, respectively, each of said output structures including
      (i) an input coupled to said logic circuit and receiving one of the logic signals;
      (ii) an output coupled to one of said pins;
      (iii) means, responsive to the logic signal on said input, for providing a stored non-inverted first signal and a non-stored non-inverted second signal and an inverted third signal of said first signal and an inverted fourth signal of said second signal; and
      (iv) means for selecting said first signal or said second signal or said third signal or said fourth signal as an output signal on said output.

21. A circuit package, according to claim 20, wherein said means for selecting comprises:
   (a) a multiplexer having four inputs for receiving, respectively, said first signal, said second signal, said third signal and said fourth signal, and having an output being said output coupled to one of said pins; and
   (b) programmable means for controlling said multiplexer to couple any one of said four inputs to said output.

22. A circuit package, comprising:
   (a) a logic circuit for producing a plurality of logic signals;
   (b) a pluraltiy of pins; and
   (c) a pluraltiy of output structures coupled between said logic circuit and said pluraltiy of pins, respectively, each of said output structures including:
      (i) an input coupled to said logic circuit and receiving one of the logic signals;
      (ii) an output coupled to one of said pins;
      (iii) means, responsive to the logic signal on said input, for providing a stored non-inverted first signal or a non-stored non-inverted second signal or an inverted third signal of said first signal or an inverted fourth signal of said second signal; and
      (iv) means for selecting said first signal or said second signal or said third signal or said fourth signal as an output signal on said output.

23. An integrated circuit package, comprising:
   (a) a logic circuit for producing a plurality of logic signals;
   (b) a plurality of pins; and
   (c) a pluraltiy of programmable output structures each being connected, respectively, between said logic circuit and one of said pins, each one of said plurality of output structures being programmable to provide, in response to one of said plurality of logic signals, a stored non-inverted first signal or a non-stored non-inverted second signal or an inverted third signal of said first signal or an inverted fourth signal of said second signal to a corresponding one of said plurality of pins, each of said plurality of output structures including
(i) data storage means for storing said stored non-inverted first signal and a fifth signal being inverted of said stored non-inverted first signal; and
(ii) programmable means for feeding back to said logic circuit said fifth signal or any one of said first through fourth signals provided to said one of said plurality of pins.

24. An integrated circuit package, according to claim 23, wherein said programmable means for feeding back comprises:
(a) a multiplexer having a first input for receiving said fifth signal, a second input for receiving said any one of said first through fourth signals provided to said one pin, and an output coupled to said logic circuit; and
(b) means for programming said multiplexer to couple said first input or said second input to said output.

25. An integrated circuit package, according to claim 24, wherein said one pin is bi-directional to transfer a signal which is external of the integrated circuit package into the integrated circuit package, and wherein said programmable means for feeding back further comprises means for controlling the feedback of the external signal to said logic circuit.

26. An integrated circuit package, according to claim 25, wherein said means for controlling the feedback of the external signal enables the feedback to said second input of said multiplexer of either the external signal or said any one of said first through fourth signals provided to said one pin.

27. An integrated circuit package, according to claim 23, wherein each of said plurality of programmable output structures is programmable to provide said stored non-inverted first signal or said non-stored non-inverted second signal or said inverted third signal or said inverted fourth signal so that a combination of said plurality of output structures for the integrated circuit package can be provided to output to said plurality of pins a combination of said stored non-inverted first signal or said non-stored non-inverted second signal or said inverted third signal or said inverted fourth signal.

28. An integrated circuit package, comprising:
(a) a logic circuit for producing a plurality of logic signals;
(b) a plurality of programmable output structures each having an input and an output being connected, respectively, between said logic circuit and one of said plurality of pins, each of said plurality of output structures being able to produce on said output in response to one of the logic signals on said input, a stored signal, inverted or non-inverted, or a non-stored signal, inverted or non-inverted, to one of said plurality of pins, and each of said plurality of output structures being programmable to provide said stored signal, inverted or non-inverted, or said non-stored signal, inverted or non-inverted, so that a combination of said plurality of output structures for the integrated circuit package can be provided to output to said pluraltiy of pins a combination of stored signals, inverted and non-inverted, and non-stored signals, inverted and non-inverted.

29. An integrated circuit package, according to claim 28, wherein each of said plurality of output structures comprises:
(a) means for providing a stored non-inverted first signal and a non-stored non-inverted second signal and an inverted third signal of said first signal and an inverted fourth signal of said second signal; and
(b) means for selecting said first signal or said second signal or said third signal or said fourth signal.

30. An integrated circuit package, according to claim 28, wherein each of said plurality of output structures comprises:
(a) means for providing a stored non-inverted first signal and a non-stored non-inverted second signal and a inverted third signal of said first signal and a inverted fourth signal of said second signal;
(b) a multiplexer having four inputs for receiving, respectively, said first signal, said second signal, said third signal and said fourth signal, and having an output coupled to said one of said plurality of pins; and
(c) programmable means for controlling said multiplexer to couple any one of said inputs to said output.

31. An integrated circuit package, according to claim 28, wherein each of said plurality of output structures comprises:
(a) means, having said input, for providing said stored non-inverted first signal and said non-stored non-inverted second signal and the inverted third signal of said first signal and the inverted fourth signal of said second signal;
(b) a multiplexer coupled to said receiving means and having four inputs receiving, respectively, said stored non-inverted first signal and said non-stored non-inverted second signal and said inverted third signal of said first signal and said inverted fourth signal of said second signal and having said output; and
(c) programmable means for controlling said multiplexer to couple any one of said four inputs to said output.

32. An integrated circuit package, according to claim 32, wherein said programmable means comprises a pair of burnable fuses, each of said burnable fuses being individually burnable.

33. An integrated circuit package, according to claim 28, wherein each of said plurality of output structures comprises:
(a) means, responsive to the logic signal on said input, for providing a stored non-inverted first signal or a non-stored non-inverted second signal or an inverted third signal of said first signal or an inverted fourth signal of said second signal; and
(b) means for selecting said first signal or said second signal or said third signal or said fourth signal.

34. An integrated circuit package, according to claim 33, wherein said means for selecting comprises:
(a) first individually programmable means for controlling the selection of said first signal or said second signal; and
(b) second individually programmable means for controlling the selection of either the first signal selected by said first individually programmable means or the third signal and the selection of either the second signal selected by said first individually programmable means or the fourth signal.

35. An integrated circuit package, according to claim 34, wherein said stored signal is a registered signal and said non-stored signal is a non-registered signal.

* * * * *

UNITED STATES PATENT AND TRADEMARK OFFICE
CERTIFICATE OF CORRECTION

PATENT NO. : 4,717,912

DATED : January 5, 1988

INVENTOR(S) : Paul W. Harvey, Bradford S. Kitson, and Warren K. Miller, Jr.

It is certified that error appears in the above-identified patent and that said Letters Patent is hereby corrected as shown below:

Column 2, line 11, "or" should be deleted.

Column 2, line 32, "of configuring" should be --by configuring--.

Column 3, line 53, "inclding" should be --including--.

Column 7, line 63, "an output coupled to one of said pins;", should be --first programmable means for--.

Column 8, line 60, "pluraltiy" should be --plurality--.

Column 9, line 50, after "signals;" a new paragraph (b) should be added as follows --(b) a plurality of pins; and-- ; and at line 51, old paragraph "(b)" should now be --(c)--.

Column 10, lines 41-42, "claim 32" should be --claim 31--.

Column 10, after line 67, claims 36-43 should be added as follows:

--36. A circuit package, according to claim 20, wherein said means for selecting is programmable.

37. A circuit package, according to claim 22, wherein said means for selecting comprises:

a) first individually programmable means for controlling the selection of said first signal or said second signal, and b) second individually programmable means for

UNITED STATES PATENT AND TRADEMARK OFFICE
CERTIFICATE OF CORRECTION

PATENT NO. : 4,717,912

DATED : January 5, 1988

INVENTOR(S) : Paul W. Harvey, Bradford S. Kitson, and Warren K. Miller, Jr.

It is certified that error appears in the above-identified patent and that said Letters Patent is hereby corrected as shown below:

controlling the selection of either the first signal selected by said first individually programmable means or the third signal and the selection of either the second signal selected by said first individually programmable means or the fourth signal.

38. A circuit package, according to claim 20, wherein said first signal is a registered signal.

39. A circuit package, according to claim 20, wherein said second signal is a non-registered signal.

40. A circuit package, according to claim 20, wherein said means for providing comprises:

a) a register for storing and outputting said first signal;

b) a conductor for conducting said second signal;

c) a first inverter for inverting said first signal to provide said third signal; and d) a second inverter for inverting said second signal to provide said fourth signal.

41. A circuit package, according to claim 40, wherein said means for selecting comprises:

UNITED STATES PATENT AND TRADEMARK OFFICE
CERTIFICATE OF CORRECTION

PATENT NO. : 4,717,912
DATED : January 5, 1988
INVENTOR(S) : Paul W. Harvey, Bradford S. Kitson, and Warren K. Miller, Jr.

It is certified that error appears in the above-identified patent and that said Letters Patent is hereby corrected as shown below:

a) a multiplexer having four inputs for receiving, respectively, said first signal, said second signal, said third signal and said fourth signal, and b) programmable means for controlling said multiplexer to couple any one of said four inputs to the single output.

42. A circuit package, according to claim 22, wherein said means for providing comprises:

a) a register for storing and outputting said first signal;

b) a conductor for conducting said second signal; and c) a logic gate having one input for receiving said first signal or said second signal and for gating through said first signal or said second signal at said one input or for inverting said first signal to said third signal or said second signal to said fourth signal.

43. A circuit package, according to claim 42, wherein said means for selecting comprises:

a) a multiplexer having two inputs for

UNITED STATES PATENT AND TRADEMARK OFFICE
CERTIFICATE OF CORRECTION

PATENT NO. : 4,717,912           Page 4 of 4

DATED : January 5, 1988

INVENTOR(S) : Paul W. Harvey, Bradford S. Kitson, and Warren K. Miller, Jr.

It is certified that error appears in the above-identified patent and that said Letters Patent is hereby corrected as shown below:

receiving said first signal and said second signal, respectively, and an output connected to said input of said logic gate;

b)    first programmable means for controlling said multiplexer to connect either of said two inputs to said output or said multiplexer; and c)    second programmable means for controlling said logic gate not to invert or to invert said first signal and said second signal.--

Signed and Sealed this

Twentieth Day of September, 1988

Attest:

DONALD J. QUIGG

Attesting Officer        Commissioner of Patents and Trademarks